(12) United States Patent
Shih et al.

(10) Patent No.: US 11,232,993 B2
(45) Date of Patent: Jan. 25, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yu-Lin Shih, Kaohsiung (TW); Chih Cheng Lee, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 78 days.

(21) Appl. No.: 16/402,127

(22) Filed: May 2, 2019

(65) Prior Publication Data

US 2020/0350223 A1    Nov. 5, 2020

(51) Int. Cl.
*H01L 23/31* (2006.01)
*H01L 21/56* (2006.01)
*H01L 23/00* (2006.01)
*H01L 23/522* (2006.01)
*H01L 23/528* (2006.01)

(52) U.S. Cl.
CPC ........ *H01L 23/3128* (2013.01); *H01L 21/561* (2013.01); *H01L 21/563* (2013.01); *H01L 21/565* (2013.01); *H01L 23/5226* (2013.01); *H01L 23/5283* (2013.01); *H01L 24/17* (2013.01); *H01L 24/96* (2013.01); *H01L 2224/0231* (2013.01); *H01L 2224/02373* (2013.01); *H01L 2224/02381* (2013.01); *H01L 2224/0401* (2013.01)

(58) Field of Classification Search
CPC . H01L 24/96; H01L 23/3121; H01L 23/3157; H01L 23/3135
See application file for complete search history.

(56) References Cited

U.S. PATENT DOCUMENTS

| | | | |
|---|---|---|---|
| 6,281,435 B1 * | 8/2001 | Maekawa | H01L 23/3121 174/539 |
| 10,043,782 B2 * | 8/2018 | Fuergut | H01L 21/568 |
| 10,804,153 B2 * | 10/2020 | Lin | H01L 24/05 |

FOREIGN PATENT DOCUMENTS

KR    10-2018-0091307 A    8/2018

* cited by examiner

*Primary Examiner* — David A Zarneke
(74) *Attorney, Agent, or Firm* — Foley & Lardner LLP

(57) ABSTRACT

A semiconductor device package includes a dielectric layer, a package body and a protection structure. The dielectric layer has a first surface, a second surface opposite to the first surface and a lateral surface extending between the first surface and the second surface. The package body is disposed on the first surface of the dielectric layer. The package body covers a first portion of the lateral surface of the dielectric layer and exposes a second portion of the lateral surface of the dielectric layer. The protection structure is disposed on the second portion of the lateral surface of the dielectric layer.

17 Claims, 22 Drawing Sheets

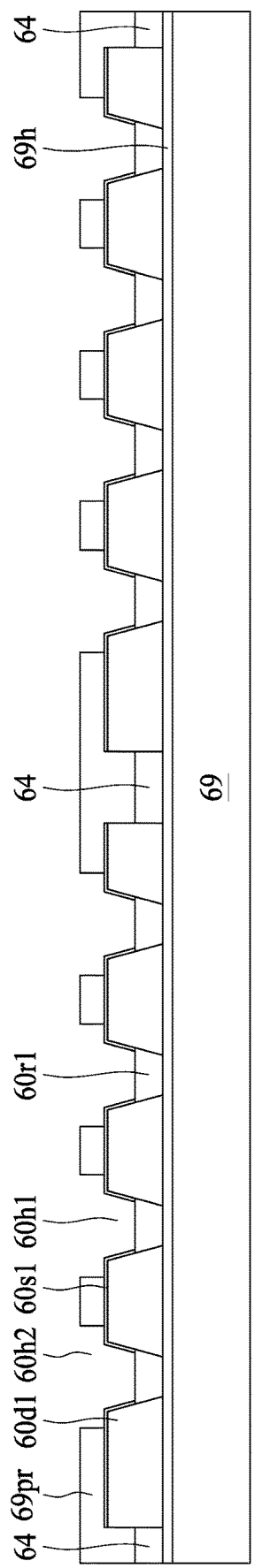

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same. More particularly, the present disclosure relates to a semiconductor device package including a dielectric layer and a molding compound, and a method of manufacturing the same.

2. Description of the Related Art

In a semiconductor device, an encapsulant (or molding compound) is used to protect electronic components on a circuit layer (having conductive layers and dielectric layers). However, due to the poor bonding capability between the encapsulant (e.g., molding compound) and the dielectric layer (e.g., polymer), a delamination may occur in a singulation process (e.g., by sawing) or in a cleaning process (e.g., flux clean, rinse or the like).

SUMMARY

In one or more embodiments, a semiconductor device package includes a dielectric layer, a package body and a protection structure. The dielectric layer has a first surface, a second surface opposite to the first surface and a lateral surface extending between the first surface and the second surface. The package body is disposed on the first surface of the dielectric layer. The package body covers a first portion of the lateral surface of the dielectric layer and exposes a second portion of the lateral surface of the dielectric layer. The protection structure is disposed on the second portion of the lateral surface of the dielectric layer.

In one or more embodiments, a semiconductor device package includes a circuit layer, an electronic component and a package body. The circuit layer has an interconnection layer and a dielectric layer covering the interconnection layer. The circuit layer has a first surface, a second surface opposite to the first surface and a lateral surface extending between the first surface and the second surface. The electronic component is disposed on the first surface of the circuit layer and electrically connected to the interconnection layer. The package body is disposed on the first surface of the circuit layer and covers the electronic component. The lateral surface of the circuit layer is recessed from a lateral surface of the package body.

In one or more embodiments, a method of manufacturing a semiconductor device package including (a) providing a carrier; (b) forming a first dielectric layer on the carrier with one or more openings; (c) forming a first conductive via within the openings and a protection structure on the carrier; (d) forming a second conductive via within the openings and on the first conductive via; and (e) forming a package body over the first dielectric layer to cover a lateral surface of the first dielectric layer and the protection structure.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, FIG. 6O, FIG. 6P and FIG. 6Q illustrate a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
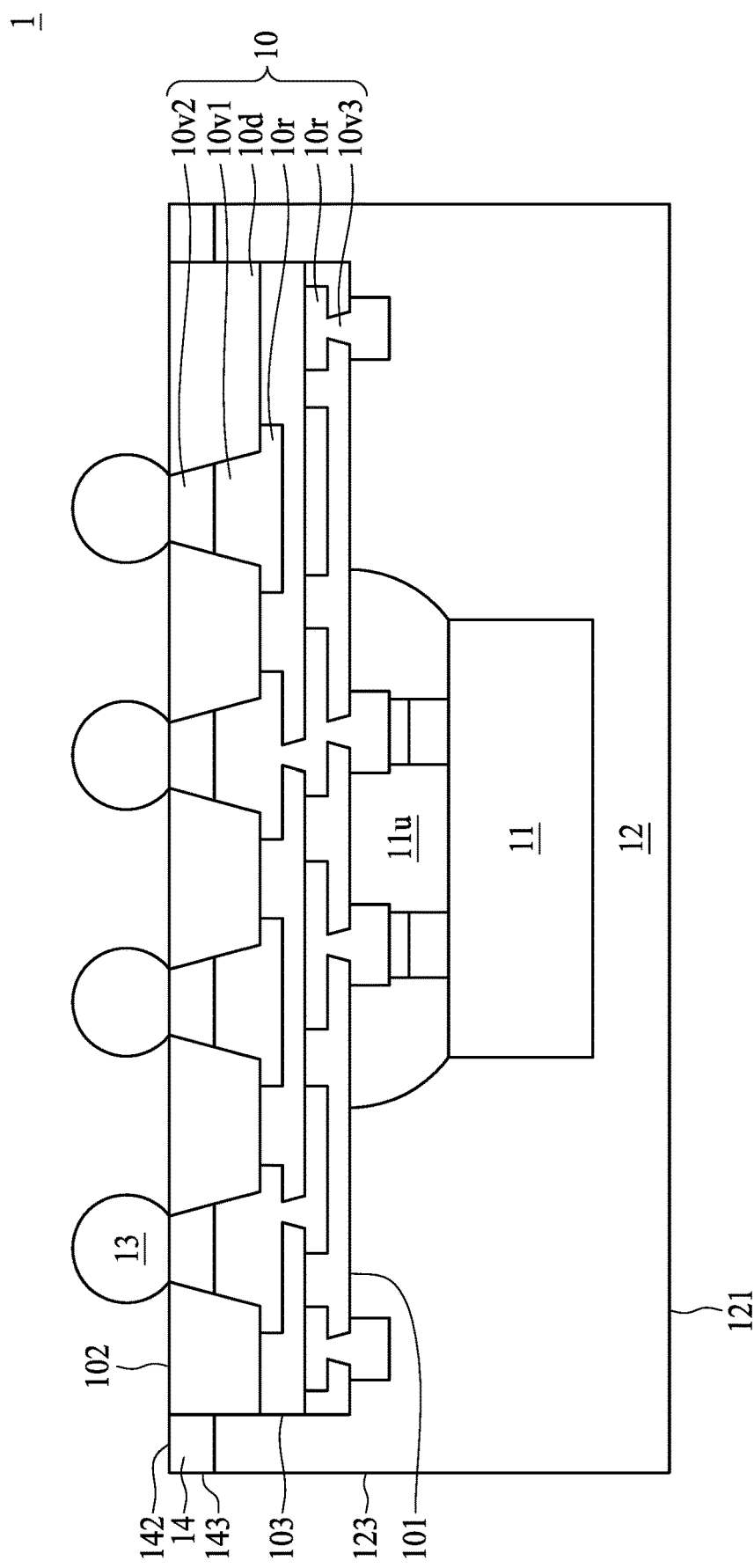
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a circuit layer 10, an electronic component 11, a package body 12, electrical contacts 13 and a protection structure 14.

The circuit layer 10 includes one or more interconnection layers (e.g., redistribution layers, RDLs) 10r and one or more dielectric layers 10d. A portion of the interconnection layer 10r is covered or encapsulated by the dielectric layer 10d while another portion of the interconnection layer 10r is exposed from the dielectric layer 10d to provide electrical connections for the electronic component 11 and the electrical contacts 13. In some embodiments, the dielectric layer 10d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of interconnection layers 10r depending on design specifications. In some embodiments, interconnection layer 10r is formed of or includes gold (Au), silver (Ag), copper (Cu), platinum (Pt), Palladium (Pd), other metal(s) or alloy(s), or a combination of two or more thereof.

The dielectric layer 10d (or the circuit layer 10) has a surface 101 (also referred to as "a first surface"), a surface 102 (also referred to as "a second surface") opposite to the surface 101 and a surface 103 (also referred to as "a lateral surface") extending between the surface 101 and the surface 102. In some embodiments, the circuit layer 10 may include conductive vias $10v1$ and $10v2$ penetrating the dielectric layer 10d to provide electrical connections between the electrical contacts 13 on the surface 102 of the dielectric layer 10d and the interconnection layer 10r. The circuit layer 10 may include a conductive via 10v3 penetrating the dielectric layer 10d to provide electrical connections between the electronic component 11 on the surface 101 of the dielectric layer 10d and the interconnection layer 10r. In some embodiments, the conductive vias 10v1, 10v2 and 10v3 taper in a direction from the surface 101 of the dielectric layer 10d toward the surface 102 of the dielectric layer 10d.

In some embodiments, the conductive via 10v1 and the conductive via 10v2 may include the same material. Alternatively, the conductive via 10v1 and the conductive via 10v2 may include different materials. In some embodiments, a seed layer is disposed between the conductive via 10v1 and the conductive via 10v2. In some embodiments, the conductive via 10v1 and the conductive via 10v2 may be formed in a single process. Alternatively, the conductive via 10v1 and the conductive via 10v2 may be formed in separate process. The conductive via 10v2 and the protection structure 14 may be formed in a single process.

The electronic component 11 is disposed on the surface 101 of the dielectric layer 10d and electrically connected to the interconnection layer 10r through the conductive via 10v3. The electronic component 11 may include a chip or a die including a semiconductor substrate, one or more integrated circuit devices, and/or one or more overlying interconnection structures disposed therein. The integrated circuit devices may include active devices such as transistors and/or passive devices such resistors, capacitors, inductors, or a combination of two or more thereof. In some embodiments, there may be any number of electronic components disposed on the surface 101 of the dielectric layer 10d depending on design specifications. In some embodiments, an underfill 10u is disposed between the electronic component 11 and the dielectric layer 10d. For example, the underfill 10u is disposed between the active surface of the electronic component 11 and the surface 101 of the dielectric layer 10d.

The package body 12 is disposed on the surface 101 the dielectric layer 10d. The package body 13 covers the electronic component 11, the underfill 11u, the surface 101 of the dielectric layer 10d and a portion (e.g., the first portion) the surface 103 of the dielectric layer 10d. The package body 12 exposes the rest portion (e.g., the second portion) of the surface 103 of the dielectric layer 10d. The package body 12 has a surface 121, a surface 122 opposite to the surface 121 and a lateral surface 123 extending between the surface 121 and the surface 122. The surface 122 of the package body 12 is located on or adjacent to the lateral surface 103 of the dielectric layer 10d and between the surface 101 and the surface 102 of the dielectric layer 10d. The surface 122 of the package body 12 is not coplanar with the surface 102 of the dielectric layer 10d. The surface 122 of the package body 12 is recessed from the surface 102 of the dielectric layer 10d. The surface 103 of the dielectric layer 10d is recessed from the lateral surface 123 of the package body 12.

In some embodiments, the package body 13 includes, for example, one or more organic materials (e.g., a molding compound, bismaleimide triazine (BT), a polybenzoxazole (PBO), a solder resist, a polypropylene (PP), an epoxy-based material, or a combination of two or more thereof), inorganic materials (e.g., silicon, a glass, a ceramic, a quartz, or a combination of two or more thereof), a liquid-film material or a dry-film material, or a combination of two or more thereof.

The protection structure 14 is disposed on the surface 122 of the package body 12 and the portion of the surface 103 of the dielectric layer 10d that is exposed from the package body 12. The protection structure 14 is in contact with the surface 122 of the package body 12 and the exposed portion of the surface 103 of the dielectric layer 10d. The protection structure 14 has a surface 142 and a surface 143 substantially perpendicular to the surface 142. The surface 142 of the protection structure 14 is substantially coplanar with the surface 102 of the dielectric layer 10d. The surface 143 of the protection structure 14 is substantially coplanar with the lateral surface 123 of the package body 12. An interface between the protection structure 14 and the package body 12 is located on or adjacent to the surface 103 of the dielectric layer 10d and between the surface 101 and the surface 102 of the dielectric layer 10d. In some embodiments, the material of the protection structure 14 is different from either the material of the package body 12 or the material of the dielectric layer 10d. For example, the protection structure 14 is formed of or includes metal, such as Cu, Ag, Au or other suitable materials. In some embodiments, the protection structure 14 is formed of or includes a glue or tape. In some embodiments, the material of the protection structure 14 is the same as the material of the conductive via 10v2. In some embodiments, the protection structure 14 and the conductive via 10v2 are formed in a single process.

The electrical contact 13 is disposed on the surface 102 of the dielectric layer 10d and electrically connected to the conductive via 10v2 that is exposed from the dielectric layer 10d. In some embodiments, the electrical contact 13 is a Controlled Collapse Chip Connection (C4), a Ball Grid Array (BGA), a Land Grid Array (LGA) or a bump.

In accordance with the embodiment illustrated in FIG. 1, since the surface 103 of the dielectric layer 10d is recessed from the lateral surface 123 of the package body 12, the interface between the dielectric layer 10d and the package body 12 would not be located at a scribing line (or cutting line), which will avoid delamination occurring at the interface between the dielectric layer 10d and the package body 12 during a singulation process. In addition, the protection structure 14 is disposed on the surface 122 of the package body 12 and the portion of the surface 103 of the dielectric layer 10d that is exposed from the package body 12, which would avoid the delamination occurring at the interface between the dielectric layer 10d and the package body 12 during a singulation process or a clean process (flux clean, rinse, plasma clean or the like).

Figure 2:
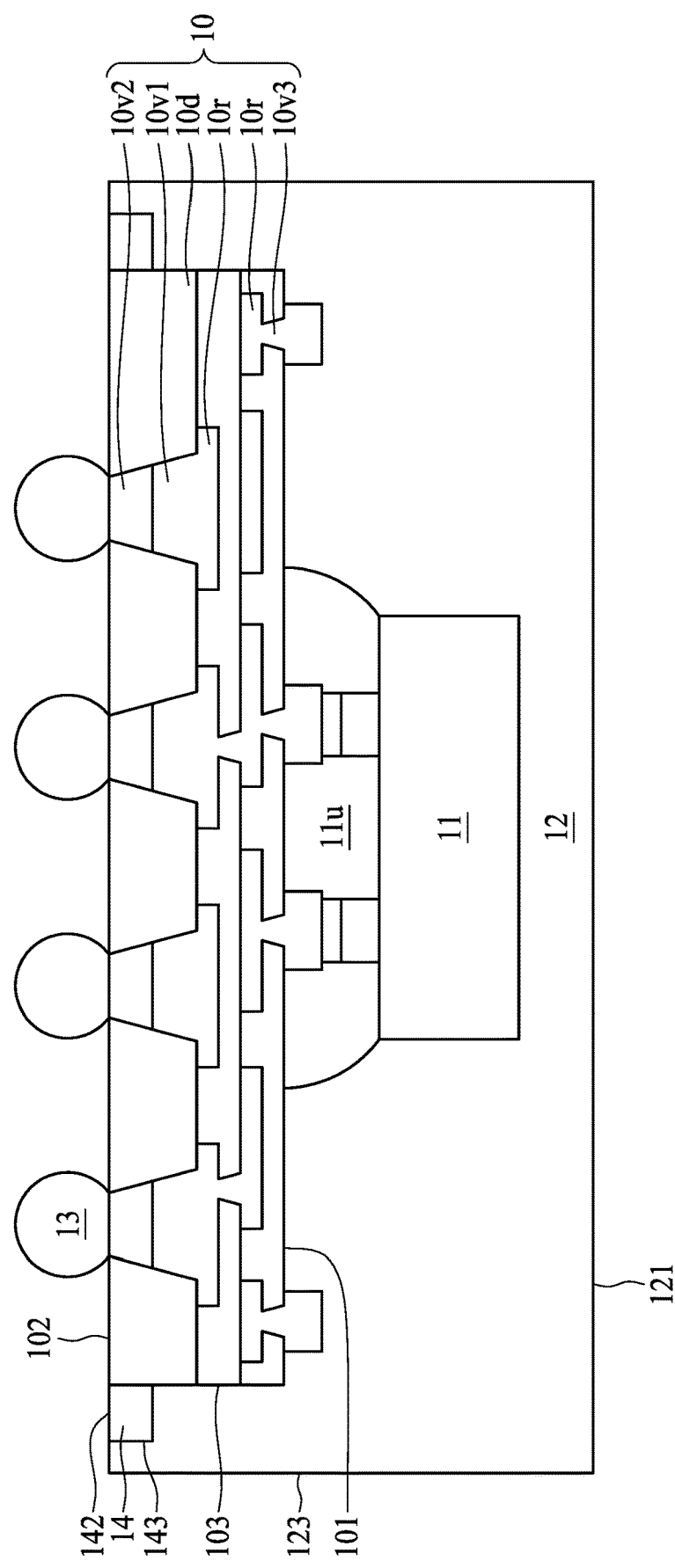
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 illustrated in FIG. 1 except that in FIG. 2, the surface 143 of the protection structure 14 is encapsulated or covered by the package body 12. Since the protection structure 14 is covered by the package body 12, the protection structure 14 would not be located at a scribing line (or cutting line), which will avoid the cutting device (e.g., blade) from being damaged during the singulation process.

Figure 3:
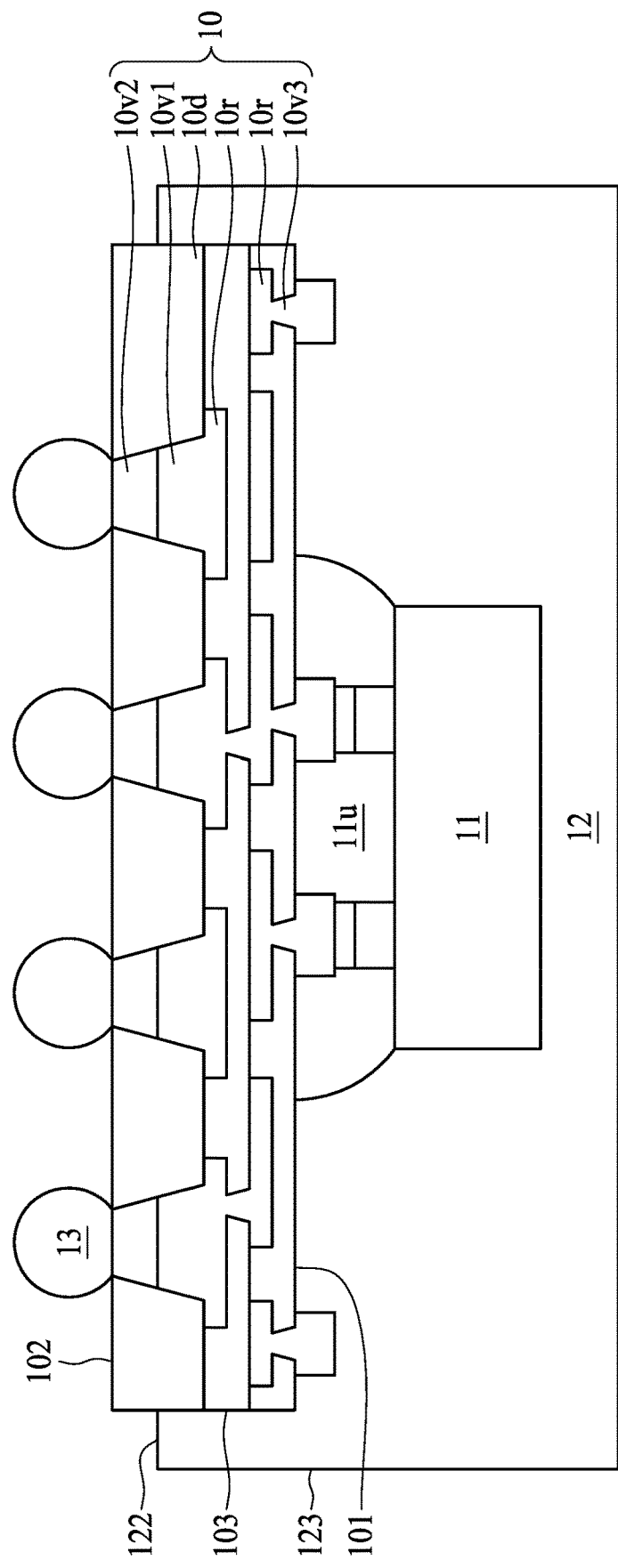
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 illustrated in FIG. 1 except that in FIG. 3, the protection structure 14 is omitted, which will avoid the cutting device (e.g., blade) from being damaged during the singulation process.

Figure 4:
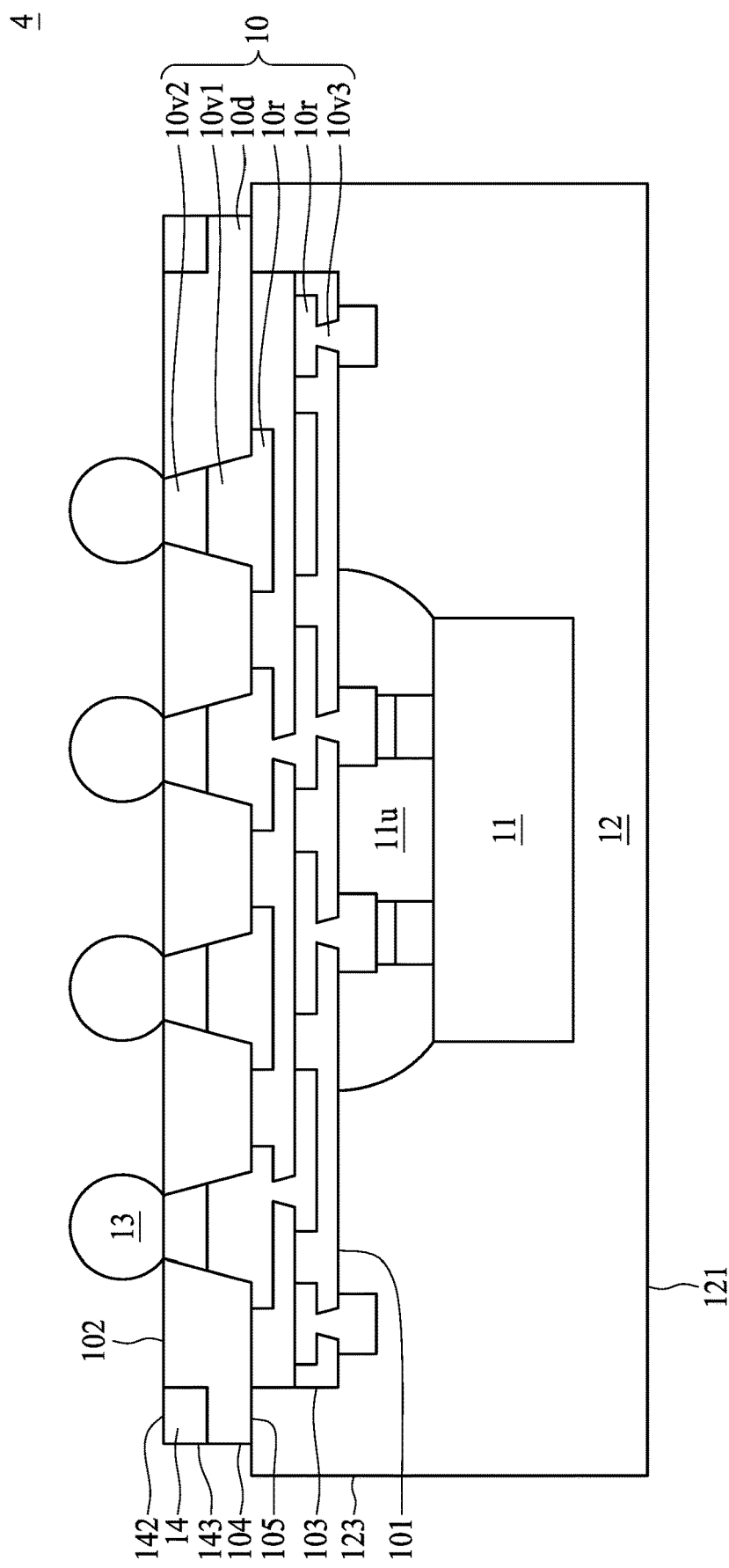
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 1 illustrated in FIG. 1, and the differences therebetween are described below.

The dielectric layer 10d further includes a surface 105 substantially parallel to the surface 101 and disposed between the surface 101 and the surface 102. For example, as shown in FIG. 4, the surface 101 and the surface 105 define a step or ladder structure. The dielectric layer 10d further includes a surface 104 substantially parallel to the surface 103. The surface 103 of the dielectric layer 10d is recessed from the surface 104 of the dielectric layer 10d.

The package body 12 covers the electronic component 11, the underfill 11u, and the surfaces 101 and 105 of the dielectric layer 10d. The package body 12 exposes the surface 104 of the dielectric layer 10d. The lateral surface 123 of the package body 12 is not coplanar with the surface 104 of the dielectric layer 10d. For example, the surface 104 of the dielectric layer 10d is recessed from the lateral surface 123 of the package body 12.

The protection structure 14 is embedded within the dielectric layer 10d. The surfaces 142 and 143 of the protection structure 14 are exposed from the dielectric layer 10d. The surface 142 of the protection structure 14 is substantially coplanar with the surface 102 of the dielectric layer 10d. The surface 143 of the protection structure 14 is substantially coplanar with the surface 104 of the dielectric layer 10d.

In accordance with the embodiment in FIG. 4, since the protection structure 14 is covered by the dielectric layer 10d, the protection structure 14 would not be located at a scribing line (or cutting line), which will avoid the cutting device (e.g., blade) from being damaged during the singulation process.

Figure 5:
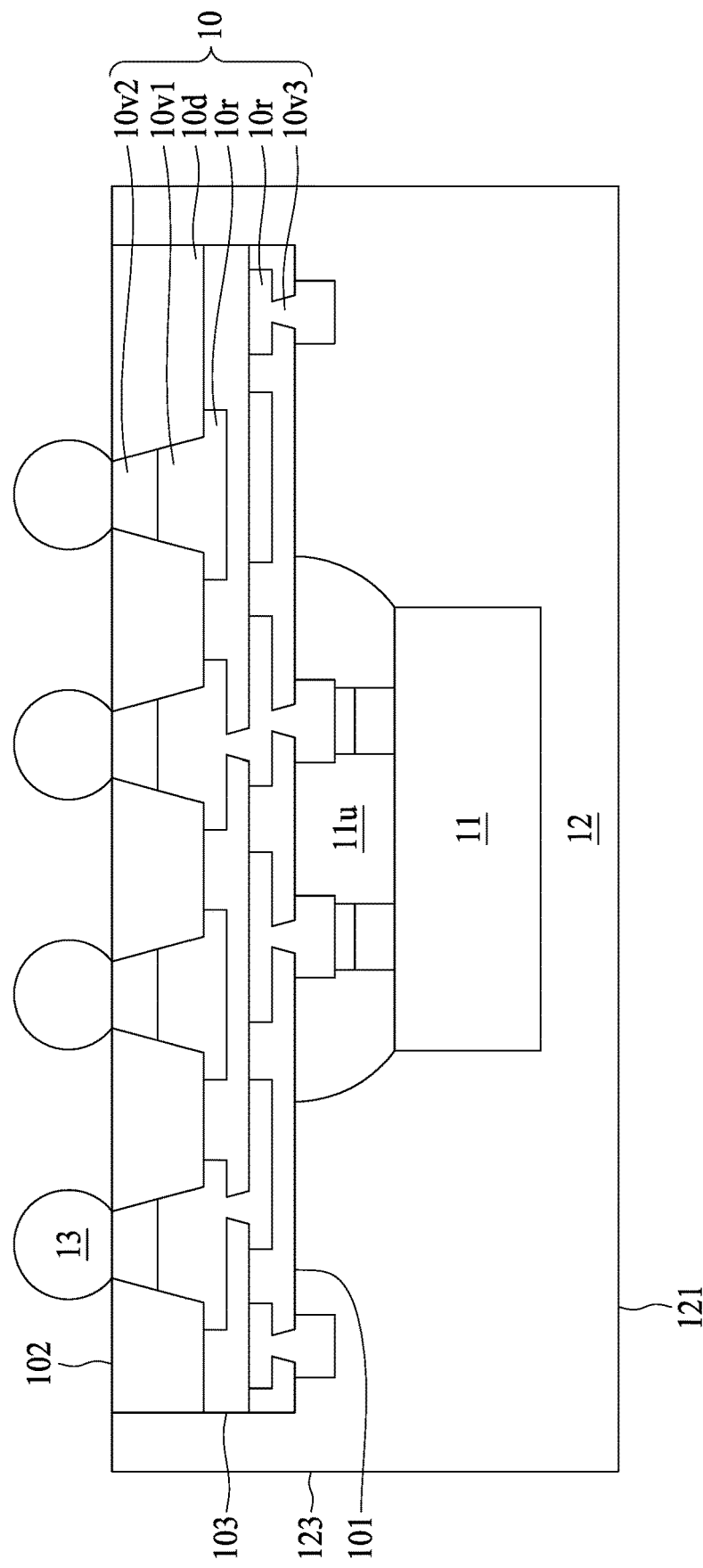
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 is similar to the semiconductor device package 1 illustrated in FIG. 1 except that in FIG. 5, the protection structure 14 is omitted, and the package body fully covers or encapsulates the surface 103 of the dielectric layer 10d, which will avoid the cutting device (e.g., blade) from being damaged during the singulation process.

FIGS. 6A, 6B, 6C, 6D, 6E, 6F, 6G, 6H, 6I, 6J, 6K, 6L, 6M, 6N, 6O, 6P and 6Q are cross-sectional views of a semiconductor structure fabricated at various stages, in accordance with some embodiments of the present disclosure. Various figures have been simplified for a better understanding of the aspects of the present disclosure.

Figure 6A:
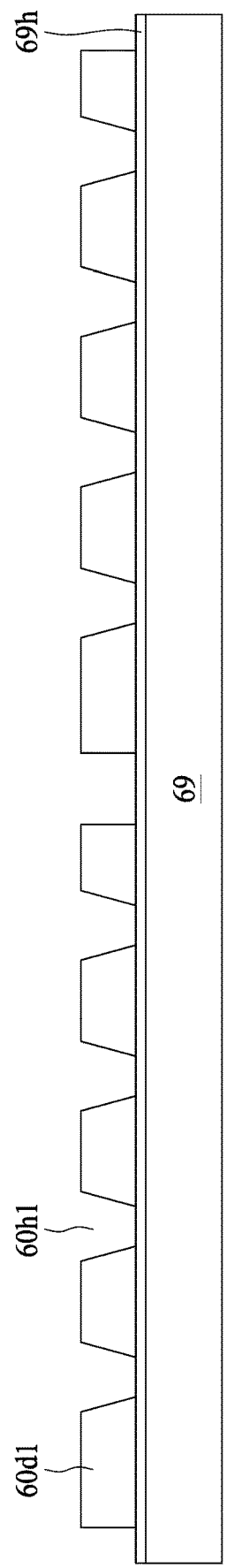

Referring to FIG. 6A, a carrier 69 is provided and an adhesive layer (or release film) 69h is disposed on the carrier 69. A dielectric layer 60d1 is formed on the adhesive layer 69h. In some embodiments, the dielectric layer 60d1 is formed by, for example, coating process or other suitable processes. The dielectric layer 60d1 defines one or more openings 60h1 to expose the adhesive layer 69h.

Figure 6B:
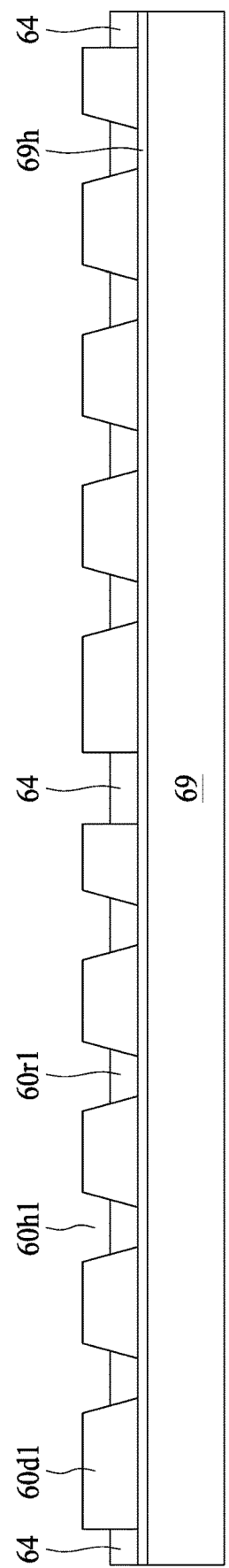

Referring to FIG. 6B, metal layers (or conductive layer) 60r1 and 64 are disposed within the openings 60h1 and on the adhesive layer 69h. In some embodiments, the metal layers 60r1 and 64 are formed by, for example, plating or other suitable processes. In some embodiments, a surface of each of the metal layers 60r1 and 64 is lower than a surface of the dielectric layer 60d1. In some embodiments, the metal layer 64 is located at a scribing line (cutting line).

Referring to FIG. 6C, a seed layer 60s1 is formed on the dielectric layer 60d1 by, for example, sputtering or other suitable processes. A photoresist 69pr is then disposed on the seed layer 60s1, the metal layer 64 and a portion of the metal layer 60r1. The photoresist 69pr defines one or more openings 60h2 to expose the metal layer 60r1 and a portion of the seed layer 60s1.

Figure 6D:
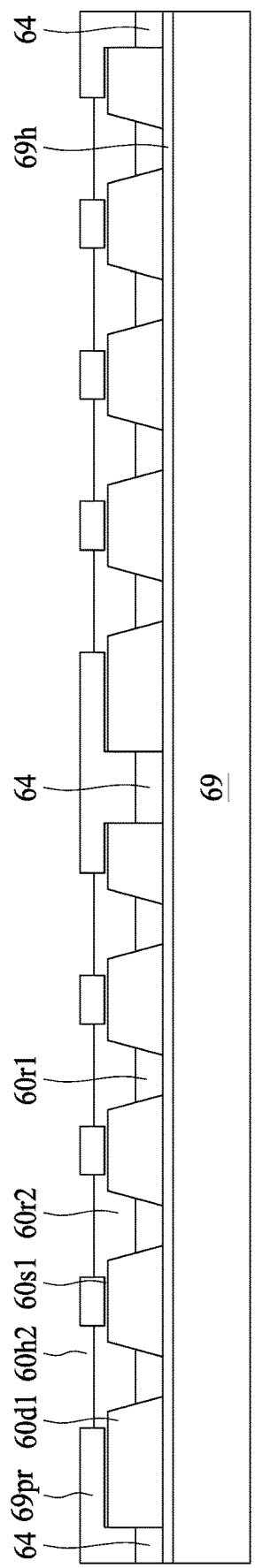

Referring to FIG. 6D, a metal layer 60r2 is disposed within the openings 60h2. The metal layer 60r2 is disposed on the metal layer 60r1 and a portion of the dielectric layer 60d1 that is exposed from the photoresist 69pr. In some embodiments, the metal layer 60r2 is formed by, for example, plating or other suitable processes.

Figure 6E:
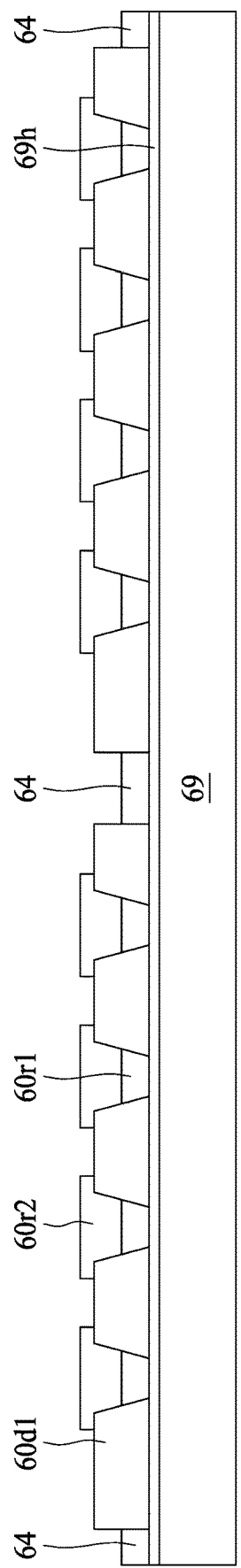

Referring to FIG. 6E, the photoresist 69pr is removed. The seed layer 60s1 is then removed by, for example, etching or other suitable processes.

Figure 6F:
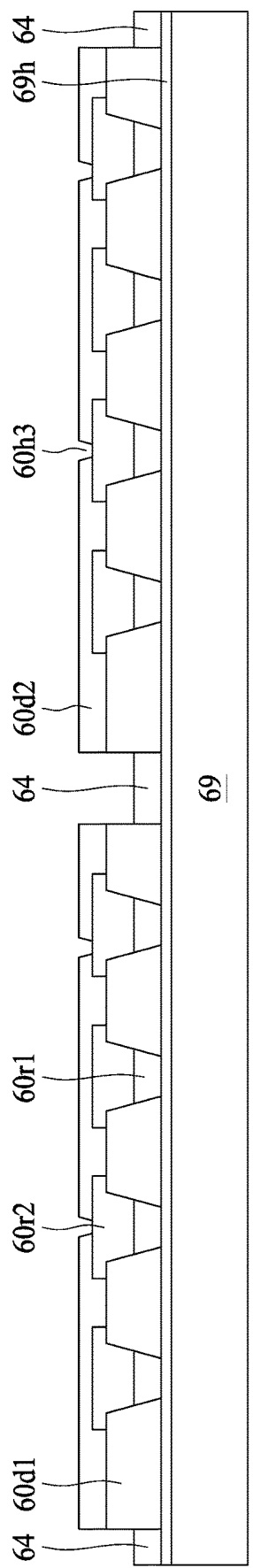

Referring to FIG. 6F, a dielectric layer 60d2 is formed on the dielectric layer 60d1 by, for example, coating process or other suitable processes. The dielectric layer 60d2 covers the dielectric layer 60d1 and a portion of the metal layer 60r2. The dielectric layer 60d2 defines one or more openings 60h3 to expose other portions of the metal layer 60r2.

Figure 6G:
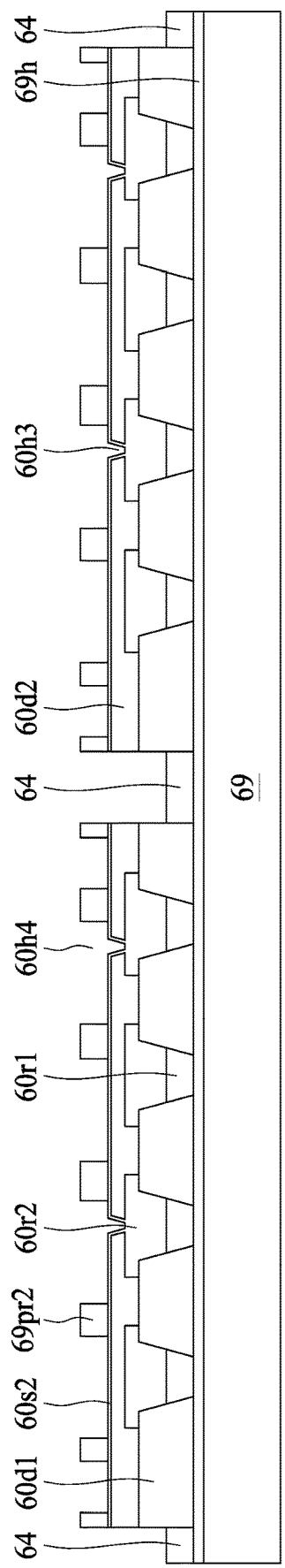

Referring to FIG. 6G, a seed layer 60s2 is formed on the dielectric layer 60d2 and within the openings 60h3 by, for example, sputtering or other suitable processes. A photoresist 69pr2 is then disposed on the seed layer 60s2. The photoresist 69pr2 defines one or more openings 60h4 to expose a portion of the seed layer 60s2.

Figure 6H:
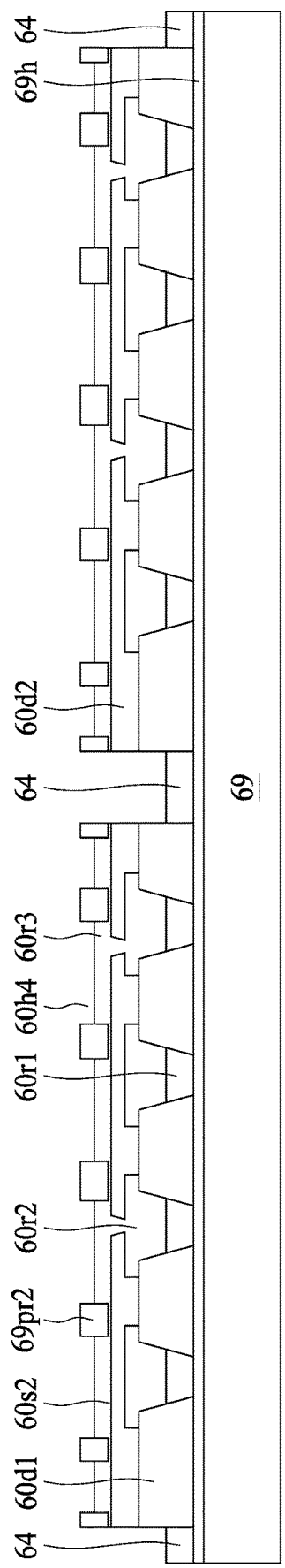

Referring to FIG. 6H, a metal layer 60r3 is disposed within the openings 60h4 and on the seed layer 60s2 by, for example, plating or other suitable processes.

Figure 6I:
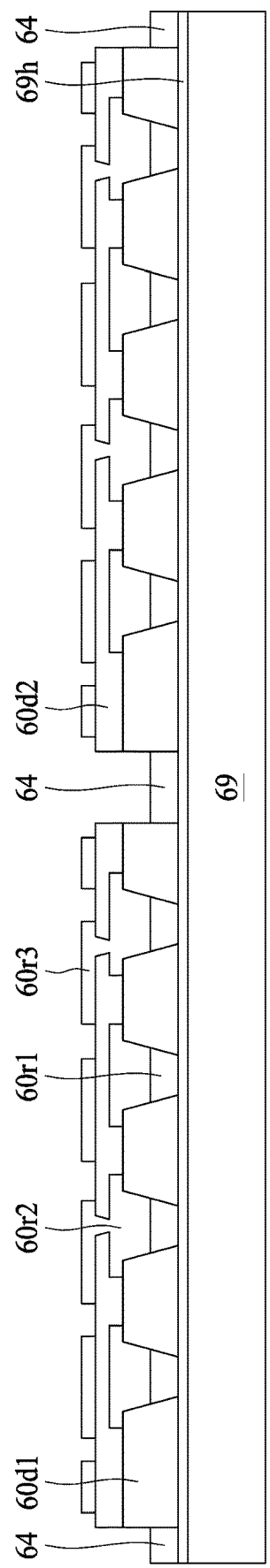

Referring to FIG. 6I, the photoresist 69pr2 is removed. A portion of the seed layer 60s2 that is covered by the photoresist 69pr2 is then removed by, for example, etching or other suitable processes.

Figure 6J:
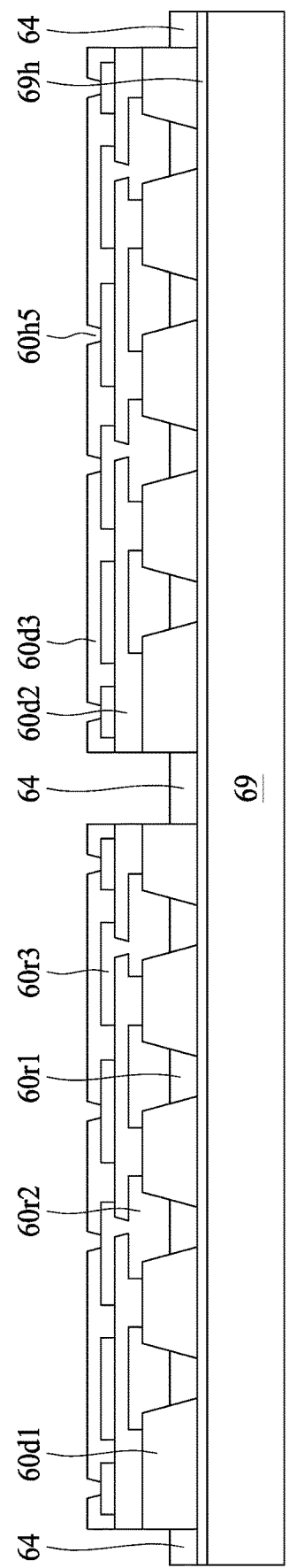

Referring to FIG. 6J, a dielectric layer 60d3 is formed on the dielectric layer 60d2 by, for example, coating process or other suitable processes. The dielectric layer 60d3 covers the dielectric layer 60d2 and a portion of the metal layer 60r3. The dielectric layer 60d3 defines one or more openings 60h5 to expose other portions of the metal layer 60r3.

Figure 6K:
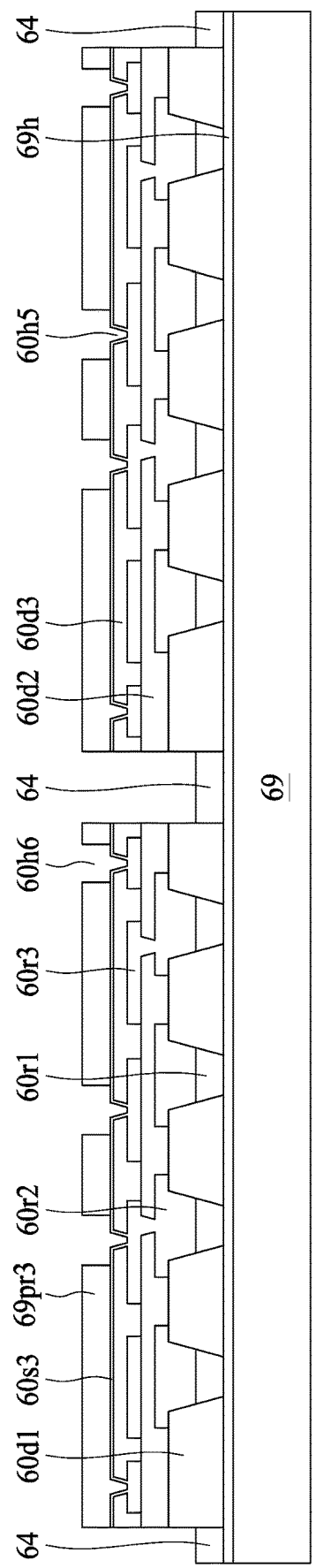

Referring to FIG. 6K, a seed layer 60s3 is formed on the dielectric layer 60d3 and within the openings 60h5 by, for example, sputtering or other suitable processes. A photoresist 69pr3 is then disposed on the seed layer 60s3. The photoresist 69pr3 defines one or more openings 60h6 to expose a portion of the seed layer 60s3.

Figure 6L:
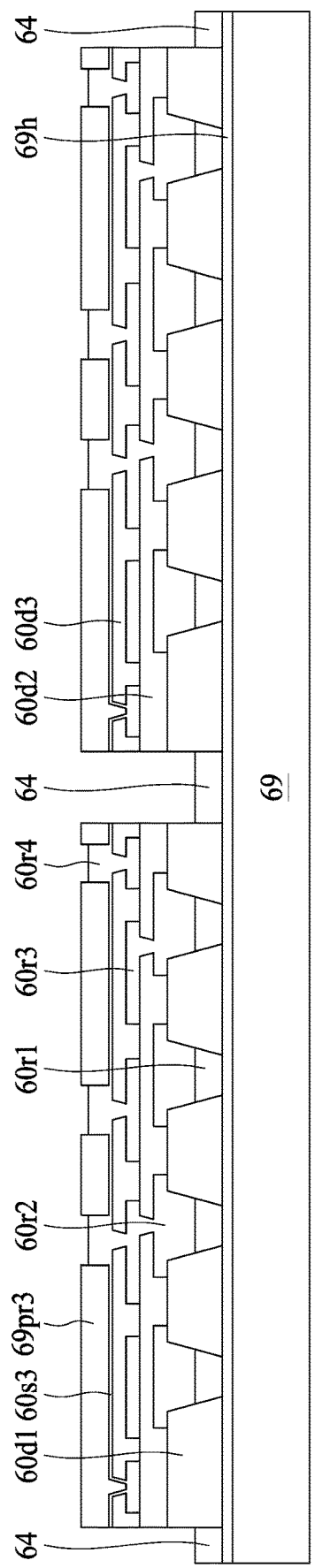

Referring to FIG. 6L, a metal layer 60r4 is disposed within the openings 60h6 and on the seed layer 60s3 by, for example, plating or other suitable processes.

Figure 6M:
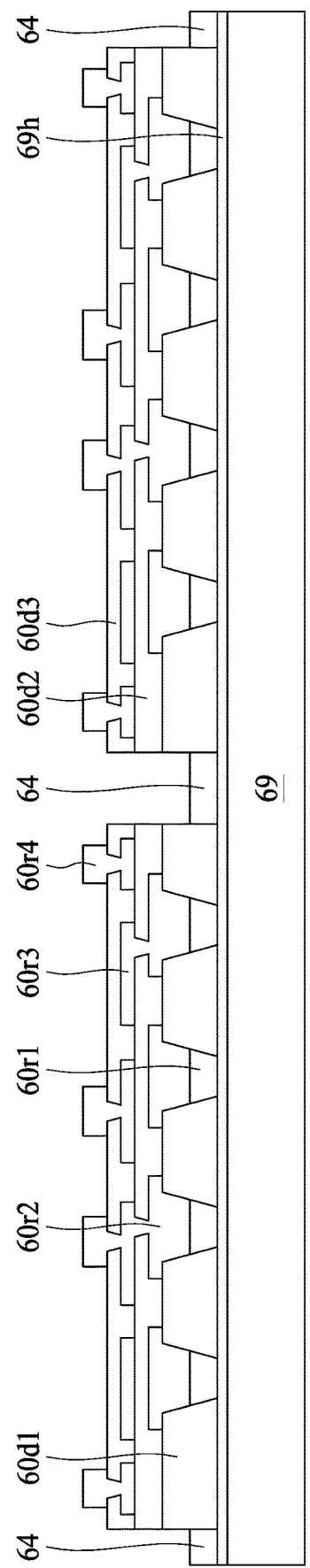

Referring to FIG. 6M, the photoresist 69pr3 is removed. A portion of the seed layer 60s3 that is covered by the photoresist 69pr3 is then removed by, for example, etching or other suitable processes.

Figure 6N:
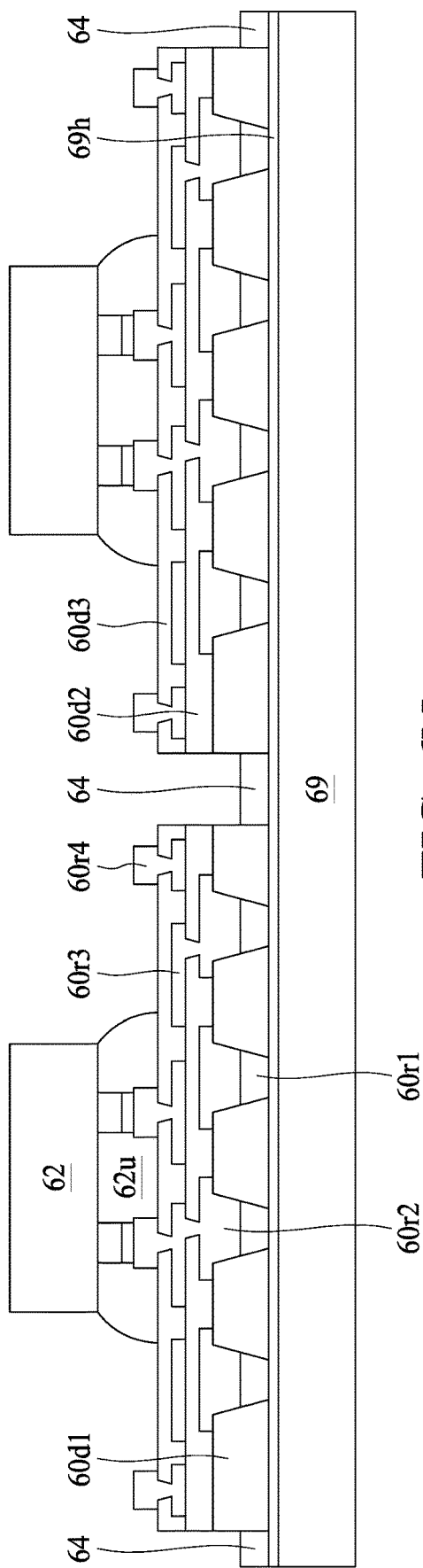
Figure 60:
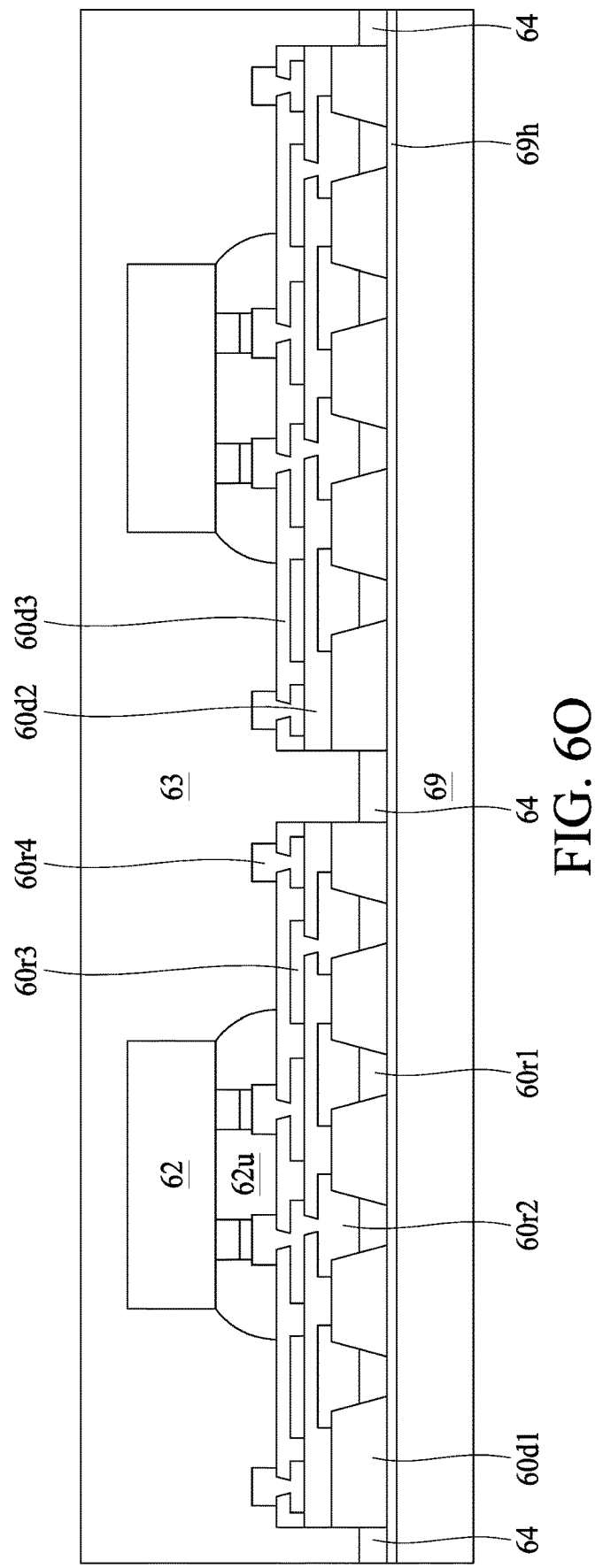

Referring to FIG. 6N, an electronic component 62 is bonded to the metal layer 60r4. An underfill 62u is formed between the electronic component 62 and the dielectric layer 60d3.

Referring to FIG. 6O, a package body 63 is formed to cover the electronic component 62, the dielectric layer 60d3, the metal layer 64, the underfill 62u and a portion of the metal layer 60r4. In some embodiments, the package body 63 is formed by, for example, molding or any other suitable processes.

Figure 6P:
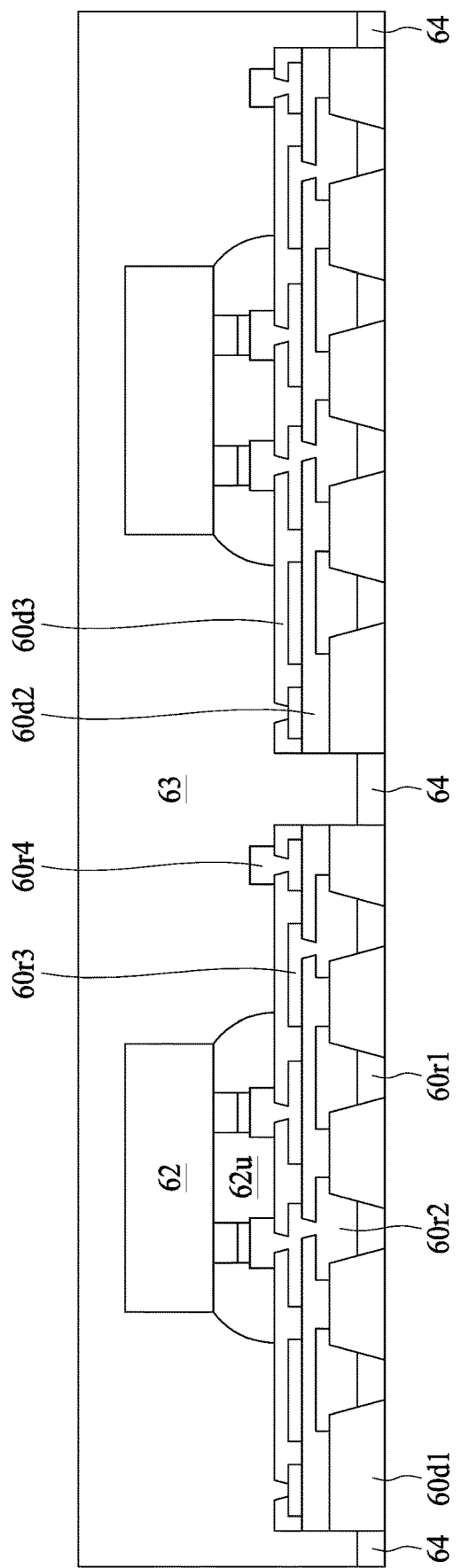

Referring to FIG. 6P, the carrier 69 and the adhesive layer 69h are removed from the dielectric layer 60d1 to expose the dielectric layer 60d1 and the metal layers 60r1 and 64. In some embodiments, the adhesive layer 69h is removed by, for example, etching or other suitable processes.

Figure 6Q:
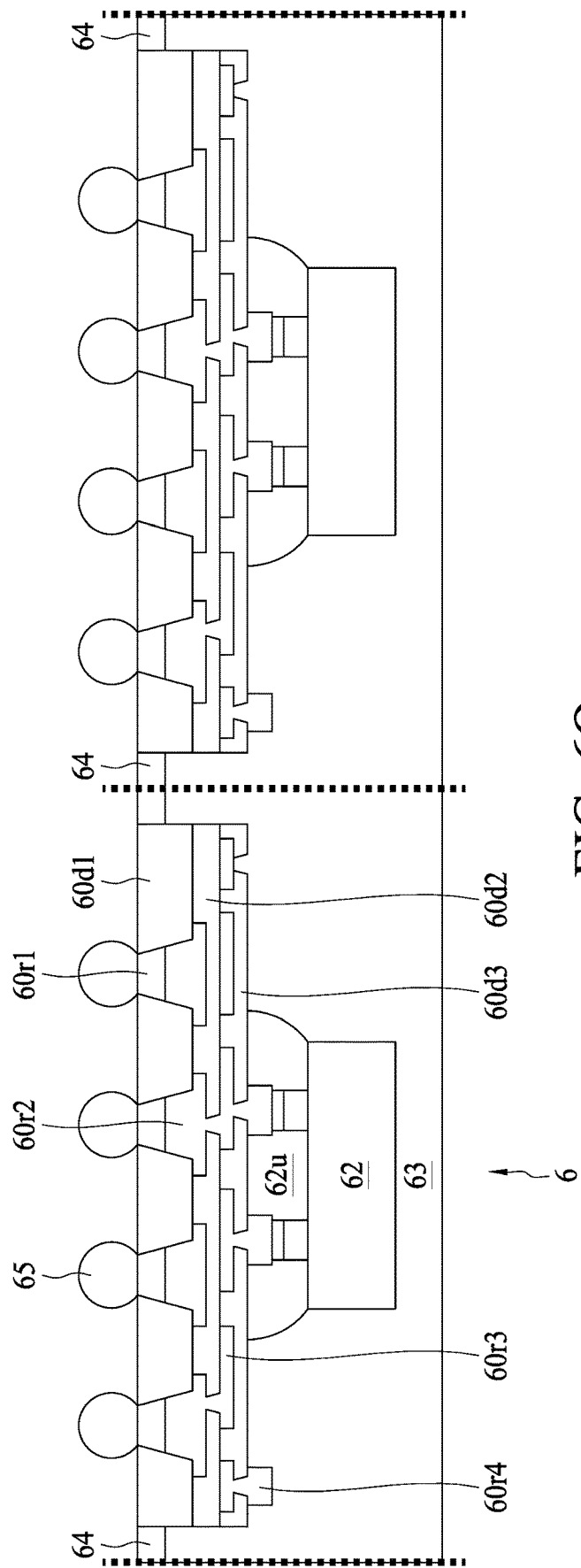

Referring to FIG. 6Q, electrical contacts 65 are disposed on the exposed portion of the metal layer 60r1. A singulation is then performed to separate out individual semiconductor device packages including the semiconductor device package 6. That is, the singulation is performed through the package body 63 and the metal layer 64. The singulation may be performed, for example, by using a dicing saw, laser or other appropriate cutting technique. In some embodiments, the semiconductor device package 6 is the same as or similar to the semiconductor device package 1 in FIG. 1.

In accordance with the embodiment illustrated in FIGS. 6A-6Q, since the metal layer 64 is located between two adjacent semiconductor device packages and at the scribing line, the interface between the dielectric layers 60d1, 60d2, 60d3 and the package body 63 would not be located at the scribing line (or cutting line), which will avoid delamination occurring at the interface between the dielectric layers 60d1, 60d2, 60d3 and the package body 63 during the singulation process. In addition, as shown in FIGS. 6B-6N (before the formation of the package body 63), the metal layer 64 can prevent water or plasma from entering an interface between the dielectric layer 60d1 and the adhesive layer 69h, which would avoid the delamination occurring at the interface between the dielectric layer 60d1 and the adhesive layer 69h during a clean process (flux clean, rinse, plasma clean or the like).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a dielectric layer having a first surface, a second surface opposite to the first surface and a lateral surface extending between the first surface and the second surface;
   a package body disposed on the first surface of the dielectric layer, the package body covering a first portion of the lateral surface of the dielectric layer and exposing a second portion of the lateral surface of the dielectric layer; and
   a protection structure disposed on the second portion of the lateral surface of the dielectric layer,
   wherein a lateral surface of the protection structure is covered by the package body.

2. The semiconductor device package of claim 1, wherein the package body has a surface between the first surface and the second surface of the dielectric layer.

3. The semiconductor device package of claim 2, wherein the protection structure is disposed on the surface of the package body.

4. The semiconductor device package of claim 1, wherein a lateral surface of the protection structure is covered by the package body.

5. The semiconductor device package of claim 1, wherein a material of the protection structure is different from a material of the package body and a material of the dielectric layer.

6. The semiconductor device package of claim 1, further comprising:
 an interconnection layer disposed within the dielectric layer;
 a first conductive via within the dielectric layer and electrically connected to the interconnection layer; and
 a second conductive via within the dielectric layer and on the first conductive via.

7. The semiconductor device package of claim 6, further comprising a seed layer disposed between the first conductive via and the second conductive via.

8. The semiconductor device package of claim 1, further comprising an electronic component disposed on the first surface of the dielectric layer and encapsulated by the package body.

9. A semiconductor device package, comprising:
 a circuit layer having an interconnection layer and a dielectric layer covering the interconnection layer, the circuit layer having a first surface, a second surface opposite to the first surface and a lateral surface extending between the first surface and the second surface;
 an electronic component disposed on the first surface of the circuit layer and electrically connected to the interconnection layer;
 a package body disposed on the first surface of the circuit layer and covering the electronic component; and
 a protection structure in contact with the circuit layer, wherein the lateral surface of the circuit layer is recessed from a lateral surface of the package body, and wherein the protection structure has a surface substantially coplanar with the second surface of the circuit layer.

10. The semiconductor device package of claim 9, wherein the package body covers a first portion of the lateral surface of the circuit layer and exposes a second portion of the circuit layer.

11. The semiconductor device package of claim 10, wherein the package body has a surface between the first surface and the second surface of the circuit layer.

12. The semiconductor device package of claim 9, wherein the package body has a surface substantially coplanar with the second surface of the circuit layer.

13. The semiconductor device package of claim 9, wherein a material of the protection structure is different from a material of the package body and a material of the dielectric layer.

14. The semiconductor device package of claim 9, further comprising:
 a first conductive via within the dielectric layer and electrically connected to the interconnection layer; and
 a second conductive via within the dielectric layer and on the first conductive via.

15. The semiconductor device package of claim 14, further comprising a seed layer disposed between the first conductive via and the second conductive via.

16. The semiconductor device package of claim 8, further comprising an underfill disposed between the dielectric layer and the electronic component.

17. The semiconductor device package of claim 9, further comprising an underfill disposed between the circuit layer and the electronic component.

\* \* \* \* \*